United States Patent [19]

Shen

[11] 4,236,171
[45] Nov. 25, 1980

[54] HIGH POWER TRANSISTOR HAVING EMITTER PATTERN WITH SYMMETRIC LEAD CONNECTION PADS

[75] Inventor: Peter Shen, Palos Verdes, Calif.

[73] Assignee: International Rectifier Corporation, Los Angeles, Calif.

[21] Appl. No.: 925,379

[22] Filed: Jul. 17, 1978

[51] Int. Cl.³ .............. H01L 23/48; H01L 29/44; H01L 29/52
[52] U.S. Cl. .................................. 357/68; 357/36; 357/55
[58] Field of Search ................ 357/35, 36, 68, 55

[56] References Cited

U.S. PATENT DOCUMENTS

| | | | |
|---|---|---|---|
| 3,309,585 | 3/1967 | Forrest | 357/68 |
| 3,316,466 | 4/1967 | Husa et al. | 357/68 |
| 3,453,503 | 7/1969 | Schulz et al. | 357/68 |
| 3,515,952 | 6/1970 | Robinson | 357/68 |
| 3,619,738 | 11/1971 | Otsuka | 357/36 |
| 3,821,780 | 6/1974 | Harland et al. | 357/36 |
| 3,896,486 | 7/1975 | Wright | 357/36 |
| 3,911,473 | 10/1975 | Nienhuis | 357/36 |
| 3,922,706 | 11/1975 | Kaiser | 357/36 |
| 4,032,961 | 6/1977 | Balisa et al. | 357/36 |
| 4,136,354 | 1/1979 | Dobkin | 357/36 |
| 4,162,507 | 7/1979 | Fischer | 357/68 |

FOREIGN PATENT DOCUMENTS 1537646  7/1968  France ....................... 357/36

*Primary Examiner*—Andrew J. James
*Attorney, Agent, or Firm*—Ostrolenk, Faber, Gerb & Soffen

[57] ABSTRACT

A high power transistor is made on a square chip with an epitaxial base construction. A glass passivated groove surrounds the device and isolates the device from adjacent devices manufactured on the same wafer. The emitter and base are interdigitated in a symmetric pattern which has four symmetrically located square enlarged lead connection regions for receiving emitter connection wires. A square enlarged base connection region is formed at one side of the interdigitated pattern for reception of the base lead. The assembly is then mounted in a housing of a type conventionally used for high power thyristors.

19 Claims, 6 Drawing Figures

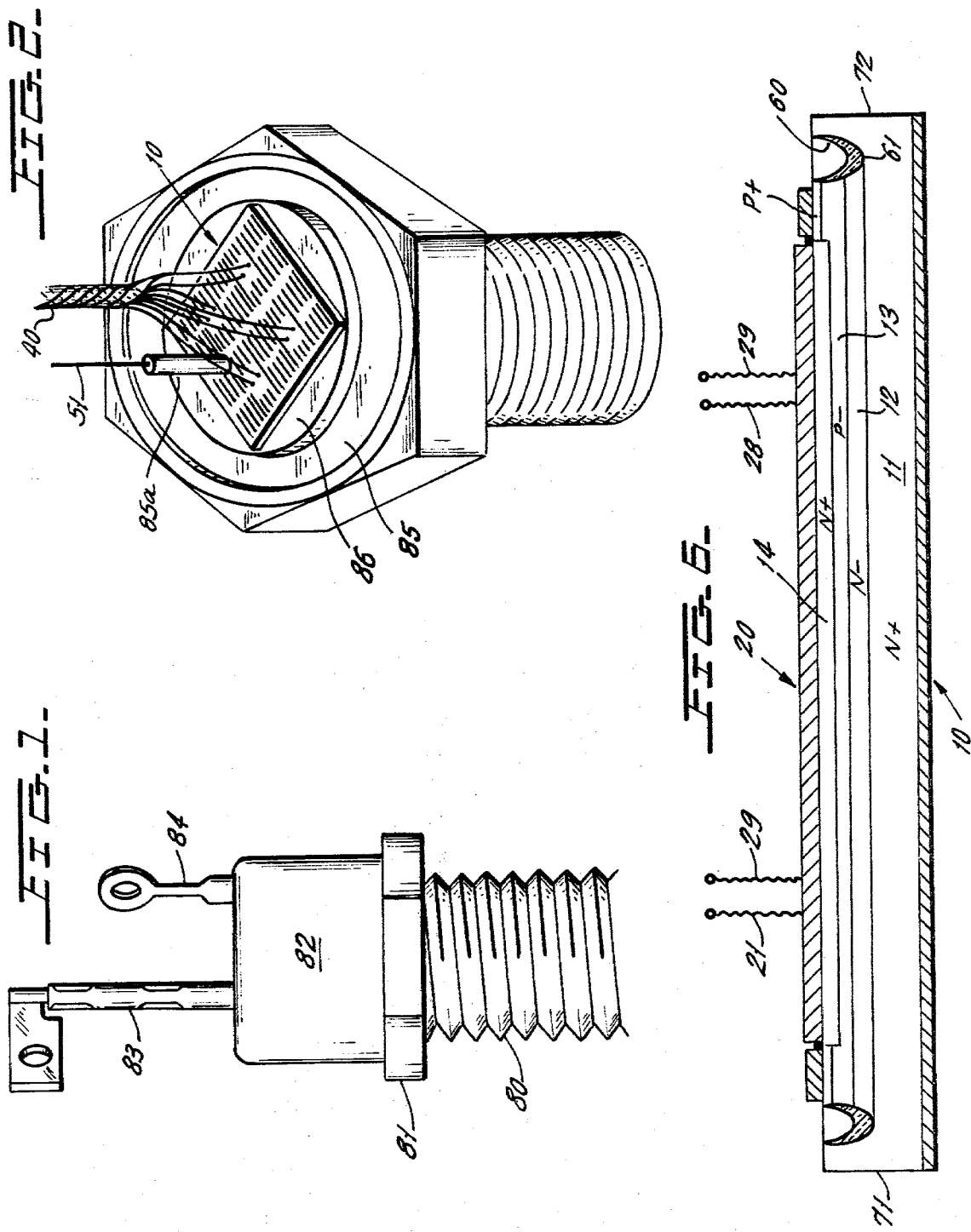

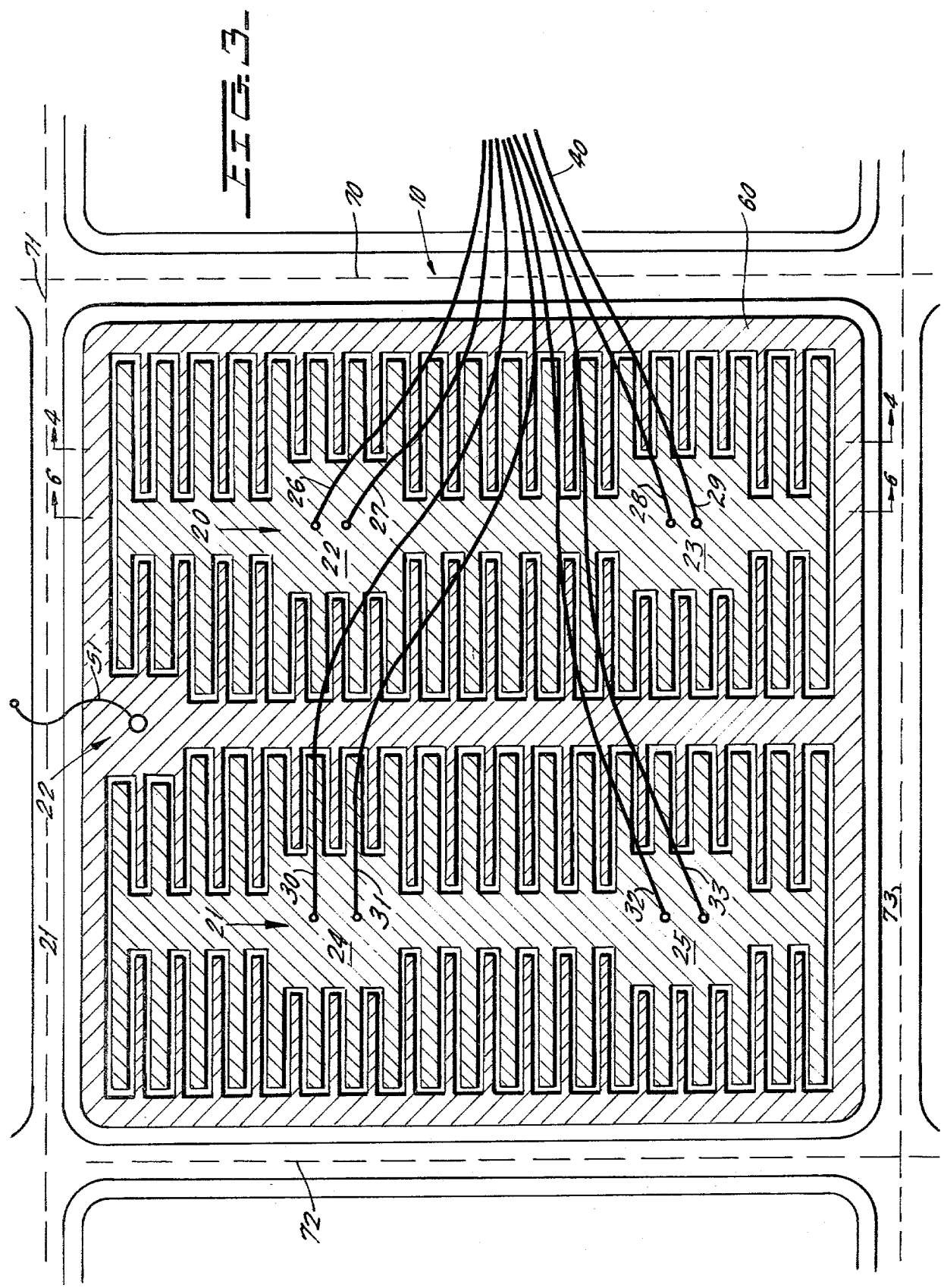

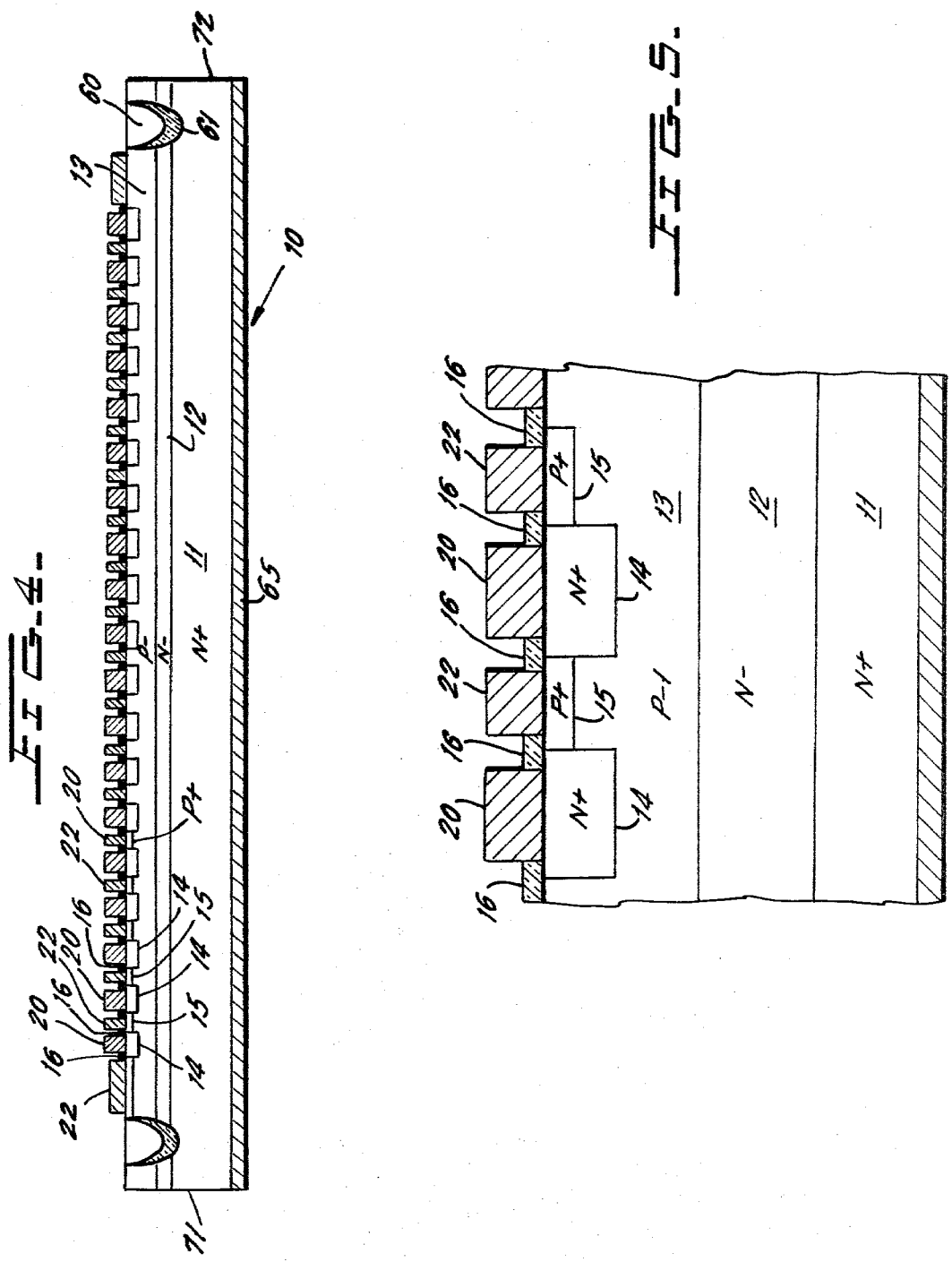

HIGH POWER TRANSISTOR HAVING EMITTER PATTERN WITH SYMMETRIC LEAD CONNECTION PADS

BACKGROUND OF THE INVENTION

This invention relates to a transistor structure and more specifically relates to a novel transistor chip arrangement which permits the manufacture of a single high current, high power transistor structure.

Thyristors are commonly used in high power switching applications such as those requiring currents of 100 amperes or more at voltages of 100 volts and above. These devices are provided in single packages such as the conventional stud mounted TO-83 package which can be easily mounted for any given switching application. The use of a transistor as a power switching device has several advantages over the thyristor since the transistor does not need a commutation circuit for turn-off. This makes the overall arrangement more compact and simpler in design. Moreover, the transistor can operate at frequencies of 5-10 kilohertz as compared to only 2-3 kilohertz for thyristors. The power capability of individual transistors, however, has been relatively low so that numerous transistors had to be connected in parallel to obtain the necessary current rating for a high power operation. A single high current, high power transistor such as one having a continuous collector current of 100 amperes or more is very desirable, but single devices capable of this rating and which can be manufactured with conventional equipment at high speed and reliability are not available.

BRIEF DESCRIPTION OF THE PRESENT INVENTION

The present invention provides a novel high current, high power transistor on a single chip and in a single package which can be used in a high power switching application and which can carry at least 120 amperes continuous current. In accordance with the invention, a chip is provided which is square in configuration and is about 472 mils on a side. The chip has an epitaxial base and an outer isolation ring which is glass-passivated at the collector-base junction. The emitter and base configurations extend to the upper surface of the chip and are interdigitated in a novel symmetric pattern which produces four symmetrically located enlarged emitter regions which can receive individual emitter leads which are subsequently twisted together to form a single emitter terminal which carries balanced current from all regions of the emitter area. The interdigitated pattern is further provided with an enlarged base region at one side of the chip for reception of the device base lead.

The configuration used permits the processing of a plurality of devices at one time on a wafer which might be 3 inches in diameter or greater. The individual chips are cut from the wafer after processing as by laser scribing. The completed chip is then mounted in a suitable well-known power-type package, such as a TO-83 package (eutectic) where the chip mount-down process uses a gold-silicon eutectic on a molybdenum buffer disk between the chip and the copper housing. This provides the ability to withstand thermal fatigue and provides high reliability needed for industrial application. The single completed device then competes well with an equivalent thyristor or parallel group of transistors where the single device is faster and less bulky than the equivalent thyristor or parallel power transistors.

BRIEF DESCRIPTION OF THE DRAWINGS

FIG. 1 is an elevational view of a type TO-83 package which is used to house the novel transistor of the invention;

FIG. 2 is a perspective view of the housing of FIG. 1 with the upper housing cap removed and the novel chip of the invention in place on the upper pedestal of the stud;

FIG. 3 is a plan view of the upper surface of the chip of the present invention and illustrates the interdigitation of the base and emitter regions and contacts and the enlarged connection pads for connection to emitter and base leads;

FIG. 4 is a cross-sectional view of FIG. 3 taken across the section line 4—4 in FIG. 3;

FIG. 5 is an enlarged view of a few of the interdigitated emitter and base regions of FIG. 4;

FIG. 6 is a cross-sectional view of FIG. 3 taken across the section line 6—6 in FIG. 3.

DETAILED DESCRIPTION OF THE DRAWINGS

The novel chip structure of the invention is best shown in FIGS. 3-6. The thickness shown in the figures is exaggerated and out of proportion for purposes of clarity. In FIG. 3, the chip 10 is a chip which is cut from a larger wafer of silicon material where a plurality of such chips are manufactured simultaneously in the usual manner. The single chip 10 of FIG. 3 is square in configuration and is about 472 mils on a side. The wafer-containing chip 10 has a thickness of about 15 mils and consists of an N+ substrate 11 which has epitaxially deposited thereon an N— region 12 which has a thickness of about 1 mil and a P— region 13 which may be diffused into the N— region 12. P— region 13 also has a depth of about 1 mil. The N— region 12 has a resistivity initially of about 5 ohm cm. while the P— region 13 has a resistivity of about 20 ohm cm.

Emitter and base regions are then diffused into the P— region 13 by conventional photolithographic processing which is well-known to those skilled in the art and which ultimately produce N+ emitter regions 14 and P+ base regions 15. Silicon oxide strips 16 passivate the upper surface of the chip where the N+ regions 14 and P+ regions 15 reach the upper surface of chip 10. The N+ regions 14 and P+ regions 15 corresponding to the emitter and base regions respectively of the transistor are interdigitated and are in the form of two spaced emitters imbedded within a single base as is best shown in FIG. 3.

In FIG. 3, the emitter and base contacts are illustrated but these overlie and follow the geometry of the emitter and base regions 14 and 15 respectively. Thus, the pattern shown in FIG. 4 is the pattern of interdigitated base and emitter fingers of one of the two emitter configurations 20 and 21 shown in FIG. 3. FIG. 4 shows the emitter contact metalization 20 which is formed on each of the emitter N+ regions 14 and also shows the base contact metalization 22 of the interdigitated base region. An operable transistor can use one or more of the individual emitter patterns 20 and 21 shown, but preferably, two emitter patterns 20 and 21 are arranged side-by-side are used.

An important feature of the preferred embodiment of the present invention is that there are two separated emitter regions formed in the common base 22 and moreover, within each of the emitter regions 20 and 21, there are enlarged lead connection pad sections 22 and 23 for region 20 and 24 and 25 for region 21, respectively. Emitter pad sections 22-25 are symmetrically arranged on the corners of a square and serve as bonding pads for the leads 26-27, 28-29, 30-31 and 32-33, respectively. Leads 26-33 are redundant pairs for each of the pads 22-25 and can be aluminum wires which are ultrasonically bonded to their respective pad region. Note that each of the pad regions 22-25 is formed by the foreshortening of the roots of the emitter fingers in that pad region and that the fingers terminate on a common straight edge. All of the conductors 26-33 are then twisted together to form the single emitter lead 40 shown in FIG. 2.

The emitter patterns 20 and 21 are further arranged to define an enlarged edge region 50 in the base 22 where the enlarged edge region 50 receives a base lead 51. Note that the region 50 is formed by the foreshortening of the emitter fingers in that region.

The exterior periphery of the chip 10 is then surrounded by an isolation groove 60 which is glass-passivated by the glass 61 as is best shown in FIGS. 4 and 6. Glass 61 passivates the collector-base junction of the transistor.

The bottom of the wafer is metalized with a collector electrode 65 which can be of any desired metal.

All of the steps in the manufacture of the chip 10 are carried out on a common wafer body so that a plurality of devices are simultaneously formed as is suggested in FIG. 3, after the manufacture of the device is completed. The chip 10 is then separated from the wafer by laser scribing along the dotted line regions 70-73. All of the chips are then separated from one another and are now ready for mounting.

The completed device may now be mounted in a conventional copper TO-83 base with a glass-to-metal seal cap. Thus, as shown in FIGS. 1 and 2, the conventional copper base consists of a threaded copper stud 80 extending from a hexagonal base 81. The housing is closed by an upper cap 82 through which extends an emitter terminal 83 and a base terminal 84.

FIG. 2 shows the chip 10 fixed atop a short copper pedestal 85 on the stud 81. A molybdenum buffer disk 86 is soldered to the top of the pedestal 85 and the collector electrode 65 of wafer 10 is soldered to the top of disk 86 by a gold-silicon eutectic solder. The twisted emitter lead 40 which consists of the twisted package of leads 26-33 of FIG. 3 is then inserted into the hollow emitter terminal 83 and the emitter terminal 83 is crimped onto lead 40 to effect an appropriate electrical connection. In a similar manner, the base lead 51 is inserted into the hollow base terminal 84 which is crimped onto the lead wire 51. A short length of plastic insulation material 85a can be installed over the lead 51 before this assembly process.

The resulting device then exhibits extremely efficient switching characteristics at very high currents when compared to prior art transistor switching arrangements. An important factor in the high power operation of the device is the use of the symmetrically located connection pads 22-25 as shown in FIG. 3 for insuring symmetric distribution of power current throughout the area of the chip 10. The symmetric and spaced arrangement of the pads insure good distribution of collector-emitter current over the effective area of the emitter.

The resulting device has been tested and the following characteristics were measured:

TABLE A

| (1) | | Range | Test Conditions |
|---|---|---|---|
| a. | $BV_{CEO}$ | 80-150V | @ 100MA |
| b. | $BV_{CBO}$ | > 150V | @ 1MA |
| c. | $H_{FE}$ | 80-150 | $I_C = 10A$ $V_{CE} = 5V$ |
| d. | $H_{FE}$ | 10 Min | $I_C = 120A$ $V_{CE} = 2V$ |
| e. | $V_{CE(SAT)}$ | 0.6-2.0V | $I_C = 120A$ $I_B = 12A$ |
| f. | $V_{BE(SAT)}$ | 1.7V | $I_C$-120A |
| g. | $T_s$ | 2.5 Microseconds | $I_C = 100A$ $I_{B1} = I_{B2} = 10A$ |
| h. | $T_f$(fall Time) | 2.5 Microseconds Max | $I_C = 100A$ $I_{B1} = I_{B2} = 10A$ |

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A high current high power transistor comprising a thin chip of semiconductor material having first and second flat parallel end surfaces; a first region of a first conductivity type extending from said first end surface and defining the collector region of said transistor; a second region of the other of the conductivity types defining the base of said transistor and extending across a central region of said chip and meeting said first region in a generally flat P-N junction; at least one emitter region of said first conductivity type extending into said second end surface of said chip and including a plurality of spaced elongated fingers extending laterally from the opposite sides of an enclosed rectangular area; said enclosed rectangular area having first and second centrally disposed enlarged, spaced connection pad areas having generally square configurations and each defined by the foreshortening of the roots of at least three of the fingers of said spaced elongated fingers which extend from said enclosed area; the material of said second and base region extending between said spaced elongated fingers of said emitter region and terminating on said second end surface of said chip and defining an elongated base-to-emitter junction which extends to said second end surface of said chip; a collector electrode connected to said first end surface of said chip; a base electrode connected to said second surface of said chip and atop said material of said second region; a base lead connected to said base electrode of said chip; an emitter electrode connected to said second end surface and extending over said at least one emitter region at said second end surface and electrically separated from said base electrode, and first and second flexible emitter leads connected to said first and second connection pad areas and connected to one another to serve as the emitter terminal for said transistor.

2. The transistor of claim 1 which includes a second emitter region which is identical to said at least one emitter region; said second emitter region being laterally displaced from said at least one emitter region; said emitter region defining a generally square emitter region centrally located on said chip; said connection pad areas of each of said emitter regions being symmetrically disposed on the corners of a square; said emitter leads of each of said bonding areas being joined together to define a single emitter lead.

3. The transistor of claim 2 which further includes a generally square base connection region extending to said second surface of said chip at a region near the edge of said chip and defined by the foreshortening of the opposing fingers at one side of each of said emitter regions; said base lead connected to said square base region.

4. The transistor of claim 1 or 2 which further includes an oxide layer disposed over said second surface of said chip in the elongated region between said base and emitter electrodes and where said second region and said emitter region meet at said second surface.

5. The transistor of claim 1 or 2 wherein at least said second region and said emitter region are of epitaxially formed silicon and are of the P and N types respectively, and wherein said regions have high conductivity in the areas at which they reach said second surface of said chip.

6. The transistor of claim 1 or 2 wherein said chip is square in configuration.

7. The transistor of claim 6 wherein at least said second region and said emitter region are of epitaxially formed silicon and are of the P and N types respectively, and wherein said regions have high conductivity in the areas at which they reach said second surface of said chip.

8. The transistor of claim 7 wherein said chip has a rectangular isolation groove extending into said second surface and around the periphery of said chip and extends through the collector-base P-N junction; and glass passivation means formed in said groove to passivate said collector-base junction.

9. The transistor of claim 1 or 2 which further includes a housing for said chip; said housing comprising a conductive pedestal having a stud extending therefrom; said collector electrode being soldered to said pedestal; and an enclosure member fixed to said pedestal and enclosing said chip; said enclosure member having external elongated base and emitter electrodes electrically connected in the interior of said enclosure member to said base and emitter leads respectively.

10. The transistor of claim 9 which further includes a molybdenum buffer disk soldered between said copper pedestal and said collector electrode.

11. The transistor of claim 1, 2 or 3 wherein at least two separate lead wires extend from each of said connection regions.

12. A transistor having spaced, interdigitated base and emitter regions which terminate in a planar manner on one surface of a semiconductor chip; each of said base and emitter regions having contacts which generally follow the interdigitated patterns of said base and emitter regions; said emitter region having a generally elongated, rectangular shape with a plurality of spaced parallel fingers extending from the opposite sides of a central region; at least first and second enlarged, spaced lead connection regions symmetrically disposed within said rectangular shaped emitter region, being defined by foreshortening the roots of at least three of the fingers of said plurality of fingers which extend from said areas, and flexible lead means extending from each of said connection regions and connected to one another to form an emitter lead for said transistor.

13. The transistor of claim 12 wherein said lead connection regions are generally square.

14. The transistor of claim 12 wherein said plurality of fingers on each side of said rectangular shape each terminate on a respective straight line.

15. The transistor of claim 14 wherein said lead connection regions are generally square.

16. The transistor of claim 12, 13, 14 or 15 which includes a second emitter region which is identical to said emitter region and which is laterally displaced from said emitter region; said emitter regions together defining a generally square emitter region centrally located on said chip; said two lead connection regions of each of said emitter regions being symmetrically disposed on the corners of a square; said emitter leads of each of said bonding areas being joined together to define a single emitter terminal.

17. The transistor of claim 16 wherein at least two separate lead wires extend from each of said connection regions.

18. The transistor of claim 16 wherein said chip is square in configuration.

19. The transistor of claim 16 wherein said chip has a glass passivated isolation groove extending into said one surface and around the periphery of said chip; said groove extending through the collector-base junction of said transistor.

* * * * *